United States Patent
Eisner et al.

(10) Patent No.: US 7,566,886 B2
(45) Date of Patent: Jul. 28, 2009

(54) THROUGHPUT ENHANCEMENT FOR SCANNED BEAM ION IMPLANTERS

(75) Inventors: Edward C. Eisner, Lexington, MA (US); Bo H. Vanderberg, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 402 days.

(21) Appl. No.: 11/503,685

(22) Filed: Aug. 14, 2006

(65) Prior Publication Data

US 2008/0035862 A1  Feb. 14, 2008

(51) Int. Cl.
*H01J 37/317* (2006.01)

(52) U.S. Cl. .............. 250/492.21; 250/492.22; 250/492.2; 250/491.1; 250/442.11

(58) Field of Classification Search ............ 250/492.21, 250/491.1, 492.1, 492.2, 492.22, 492.3, 398, 250/400, 453.11, 440.11, 442.11, 441.11
See application file for complete search history.

(56) References Cited

U.S. PATENT DOCUMENTS

| | | | | |
|---|---|---|---|---|
| 4,980,562 A * | 12/1990 | Berrian et al. | ........... | 250/492.2 |
| 6,580,083 B2 | 6/2003 | Berrian | | |
| 6,710,359 B2 * | 3/2004 | Olson et al. | ........... | 250/492.21 |
| 6,870,170 B1 * | 3/2005 | Farley et al. | ........... | 250/492.21 |
| 2002/0175297 A1 * | 11/2002 | Scheuer et al. | ......... | 250/492.21 |
| 2003/0068215 A1 * | 4/2003 | Mori et al. | .................. | 414/217 |
| 2005/0181584 A1 * | 8/2005 | Foad et al. | .................. | 438/514 |
| 2005/0232749 A1 * | 10/2005 | Vanderpot et al. | ........... | 414/805 |
| 2005/0254932 A1 * | 11/2005 | Kellerman et al. | .......... | 414/680 |
| 2005/0269527 A1 * | 12/2005 | Murrell et al. | ......... | 250/492.21 |
| 2006/0113489 A1 * | 6/2006 | Ray et al. | ............. | 250/492.21 |
| 2006/0243920 A1 * | 11/2006 | Ray et al. | ............. | 250/492.21 |
| 2006/0289800 A1 * | 12/2006 | Murrell et al. | ......... | 250/492.21 |
| 2007/0259511 A1 * | 11/2007 | Murrell et al. | ............. | 438/535 |

OTHER PUBLICATIONS

International Search Report, Int'l Application No. PCT/US2007/017935, Int'l Filing Date Aug. 13, 2007, 3 pgs.
"Productivity Comparisons of Various Wafer Scanning Schemes in Ion Implanters, using "Beam Utilization" as the Figure of Merit", D.A. Brown, M. Tsukihara, A. Ray and P. Splinter, Proc. IIT, Part 11, 6 pgs.

* cited by examiner

*Primary Examiner*—David A Vanore
*Assistant Examiner*—Michael J Logie
(74) *Attorney, Agent, or Firm*—Eschweiler & Associates, LLC (57) ABSTRACT

An ion implantation system that optimizes productivity that includes an ion generator configured to implant ions into a workpiece by scanning the ions along an axis in a first direction, a movable stage configured to move the workpiece in a second direction generally orthogonal to the first direction, an ion detection component configured to measure ion dosage at approximately an outer edge of the workpiece, a first direction driver that receives commands from the controller to move in a fast scan speed on wafer or a fast scan speed off wafer and a second direction driver that receives commands from the controller to move the workpiece movable stage in a slow scan speed.

29 Claims, 5 Drawing Sheets

THROUGHPUT ENHANCEMENT FOR SCANNED BEAM ION IMPLANTERS

FIELD OF THE INVENTION

The present invention relates generally to semiconductor processing systems, and more specifically to a system and method for optimizing efficiency of an ion beam associated with ion implantation of a semiconductor substrate.

BACKGROUND OF THE INVENTION

In the semiconductor industry, various manufacturing processes are typically carried out on a substrate (e.g., a semiconductor wafer or workpiece) in order to achieve various results. Processes such as ion implantation, for example, can be performed in order to obtain a particular characteristic on or within the substrate, such as altering the conductivity of a portion of the wafer. A desired impurity material is ionized and accelerated to form an ion beam of prescribed energy, and the ion beam is directed at the surface of the wafer. The energetic ions in the beam penetrate into the semiconductor material and are embedded into the crystalline lattice of the semiconductor material to form a region of desired conductivity.

Ion implantation systems usually include an ion source or generator for converting a gas or solid material into a plasma. Ions are extracted from the plasma and accelerated to either the desired energy, or to a transport energy. The ion beam is mass analyzed to eliminate undesired ion species, and then, if necessary, accelerated to the desired energy level and directed onto the target workpiece. Most ion implanters use an ion beam that is much smaller in diameter than the wafer and distribute the dose from the ion beam uniformly across the wafer by scanning the beam, moving the wafer mechanically, by a combination of beam scanning and wafer movement, and the like.

In many systems the beam is scanned rapidly in one dimension (fast scan) to form a uniform "ribbon" beam, and then the wafer is scanned slowly through the ribbon in a direction perpendicular to the fast scan. The requirement for excellent surface uniformity means that the beam must be scanned completely off the workpiece in both dimensions. Thus the total implanted area is larger than the workpiece and the beam is not completely utilized. The efficiency of the beam is defined by the ratio of the wafer size to the total implanted area and is always less than 1.

Other inventions have proposed optimized scan waveforms, for example, circular, to decrease the implanted area for electrostatic, magnetic, and mechanical scanners with the overall goal of improving productivity. Typically, in these inventions the scan rate is held constant but the scan width varies with the slow scan. Thus the implanted area is closer in shape to the workpiece, increasing efficiency. However it can be desirable to have a square implanted area (constant scan amplitude) because it allows the beam to always pass over current-measuring devices (dose cups), typically located just beyond the edge of the wafer, and the measured current can then be used in feedback systems to improve uniformity.

Therefore, a need exists for a method for optimizing the scanning of an ion beam, while retaining the desirable constant scan amplitude.

SUMMARY OF THE INVENTION

The present invention overcomes the limitations of the prior art. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

According to an aspect of the present invention is directed generally toward a method for optimizing efficiency of an ion beam during ion implantation into a substrate employing an approximate square or rectangular scan area. The improvement comes from increasing the speed of the fast scan when the beam is not directed onto the workpiece. Thus while any portion of the beam is directed onto the workpiece, the fast scan velocity is, on average, $V_{FastScanOnWafer}$, and once the beam passes off the wafer, the fast scan speed is increased to ($V_{FastScanOffWafer}$). The ratio, $V_{FastScanOffWafer}/V_{FastScanOnWafer}$ is typically in the range of 2 to 25. The increased scan speed off the wafer decreases the dose wasted off the wafer and effectively decreases the implanted area, thus increasing efficiency.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention is directed generally towards a system and method for optimizing ion beam utilization efficiency when scanning an ion beam in an ion implantation system. More particularly, the method provides an optimization based on employing two or more fast scan speeds in the fast scan axis. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Productivity in ion implantation systems is generally defined by several factors. For example, productivity can be quantified by a capability of the system to generate a particular amount of ion beam current, a ratio between a number of ions that are generated by the system to a number of ions actually implanted in a substrate (e.g., a silicon wafer), a ratio between an amount of time in which the substrate is being implanted with ions and an amount of time taken for positioning the substrate for ion implantation, and the like. The ratio of generated ions to ions actually implanted in the substrate, for example, is generally referred to as "ion beam efficiency", as will be discussed hereafter.

For low dose ion implants (e.g., ion implantations having a dosage of less than approximately $1\times10^{14}$ cm$^2$), a current of the ion beam typically ranges well below limitations in the capability of the ion implantation system, and the ion beam current can be increased in order to account for a potentially-low ion beam efficiency. However, for high dose ion implants (e.g., ion implantations having a dosage of greater than approximately $1\times10^{15}$ cm$^2$), the ion beam current is typically at or near the maximum capability of the ion implantation system, and ion beam efficiency has a much greater significance to the productivity of the system for optimal ion implantations. Such ion implantations are referred to as "beam current limited" implants, wherein the efficiency of the ion beam is an important factor in determining the most advantageous usage of various types of ion implantation systems. For example, multiple-substrate ion implantation systems, or batch implanters, traditionally have significantly higher ion beam efficiency than single substrate systems, thus making the multiple-substrate systems the conventional tool of choice for high dose implants. However, single-substrate ion implantation systems, or serial systems, have various other advantages, such as contamination control, process lot size flexibility, and, in some configurations, incident beam angle control. Therefore, it would be highly desirable for the single-substrate system to be utilized if productivity could be enhanced.

Therefore, the present invention is directed to an optimization of ion beam utilization efficiency in a single-substrate ion implantation system, wherein various ion implantation operating parameters, such as linear scan speeds and accelerations of the substrate, are controlled based on characteristics of various individual processes performed by the ion implantation system. It should be noted, however, that the present invention can also be implemented in various other ion implantation systems, such as the above-mentioned batch implanters, and all such implementations are contemplated as falling within the scope of the present invention.

In a preferred embodiment of the present invention, several advantages over conventional methods using typical single-substrate or single-wafer ion implantation systems are provided. For example, conventional single-substrate ion implantation systems or serial implanters have generally fixed linear scan speeds and accelerations in one or more axes (e.g., in a slow-scan axis), and are not typically optimized for ion beam utilization efficiency. A control of various ion implantation operating parameters, as will be described hereafter, however, can lead to increases in various productivity efficiencies. For example, controlling linear scan speeds and accelerations of the substrate or the ion beam scan in two or more axes for a given process recipe can provide for an optimization of the efficiency of the ion beam that is not generally possible in the conventional ion implantation systems.

Figure 1:
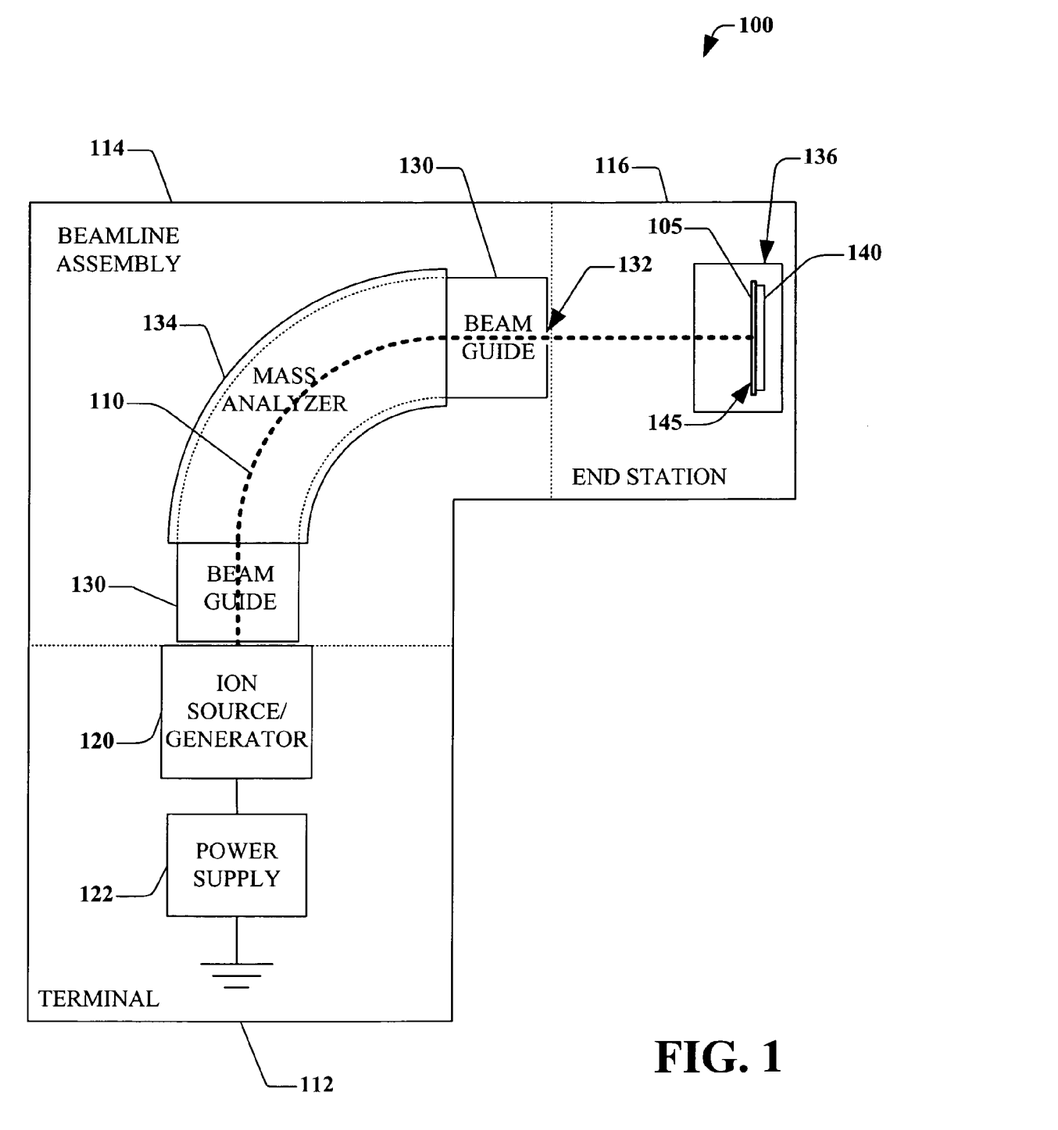
FIG. 1 is a plan view of an exemplary ion implantation system according to one aspect of the present invention.

Referring now to the figures, in accordance with one exemplary aspect of the present invention, FIG. 1 illustrates an exemplary hybrid-scan, single-substrate ion implantation system 100, wherein the system is operable to scan an ion beam 110 in a fast scan direction and scan the substrate 105 in the orthogonal slow scan direction. As stated above, various aspects of the present invention may be implemented in association with any type of ion implantation apparatus, including, but not limited, to the exemplary system 100 of FIG. 1. The exemplary ion implantation system 100 comprises a terminal 112, a beamline assembly 114, and an end station 116 that forms a process chamber in which the ion beam 110 is directed to a workpiece location. An ion source 120 in the terminal 112 is powered by a power supply 122 to provide an extracted ion beam 110 to the beamline assembly 114, wherein the source 120 comprises one or more extraction electrodes (not shown) to extract ions from the source chamber and thereby to direct the extracted ion beam 110 toward the beamline assembly 114.

The beamline assembly 114, for example, comprises a beamguide 130 having an entrance near the source 120 and an exit with a resolving aperture 132, as well as a mass analyzer 134 that receives the extracted ion beam 110 and creates a dipole magnetic field to pass only ions of appropriate momentum or range thereof (e.g., a mass analyzed ion beam 110 having ions of a desired mass range) through the resolving aperture 132. A scan system scans the beam in the fast scan direction. It may be electrostatic, magnetic, or some other system. The beam then passes through a parallelizing system to make the beams at all scan angles parallel. The beam is then delivered to the substrate 105 on a workpiece scanning system 136 associated with the end station 116. Various beam forming and shaping structures (not shown) associated with the beamline assembly 114 may be further provided to maintain and bound the ion beam 110 when the ion beam is transported along a beam path to the substrate 105 supported on the workpiece scanning system 136.

The end station 116 illustrated in FIG. 1, for example, is a "serial" type end station that provides an evacuated process chamber in which the single substrate 105 (e.g., a semiconductor wafer, display panel, other workpiece, etc.) is supported along the beam path for implantation with ions. It should be noted, however, that batch or other type end stations may alternatively be employed, and fall within the scope of the present invention. In an alternative aspect of the present invention, the system 100 comprises a workpiece scanning system capable of scanning in both the fast and slow scan directions. In yet another aspect of the present invention, the system 100 comprises a system wherein both ion beam axes are either electrically or magnetically scanned or a combination thereof. Accordingly, all such scanned or non-scanned ion beams 110 are contemplated as falling within the scope of the present invention.

Figure 2:
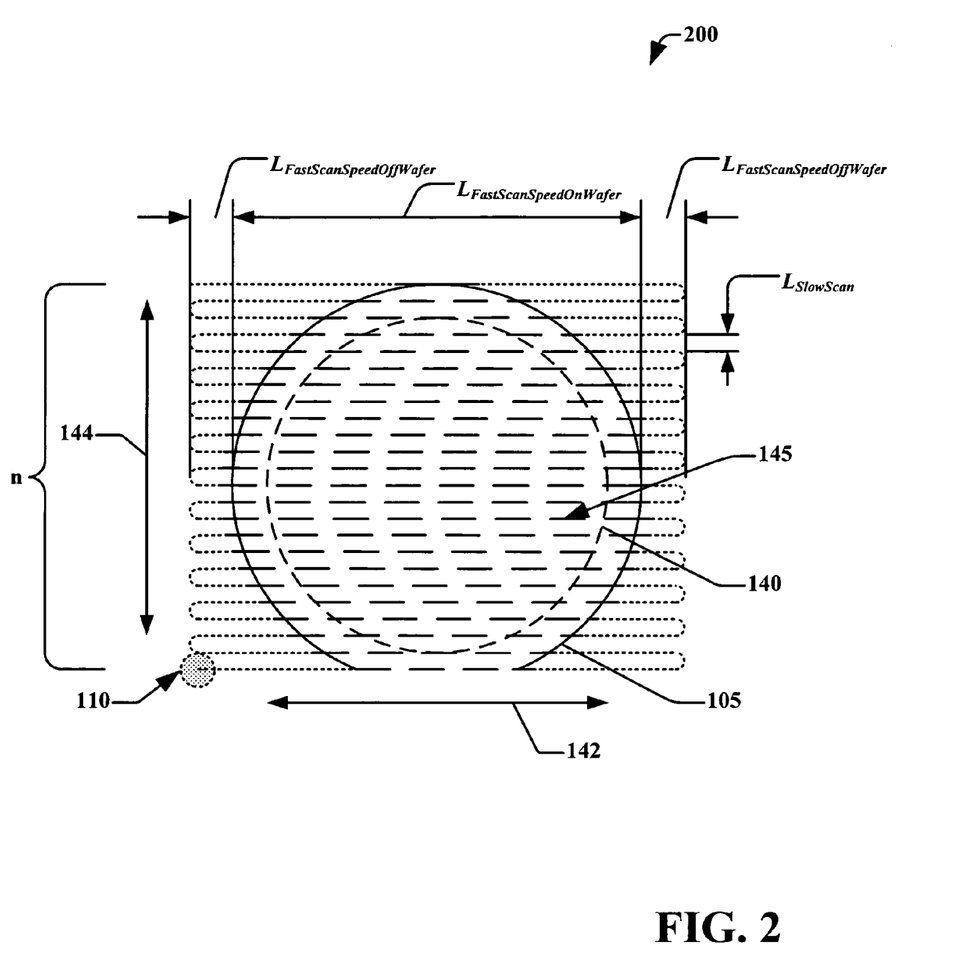
FIG. 2 is a plan view of an exemplary scanning system ion beam path according to another aspect of the present invention.

According to one aspect of the present invention, FIG. 2 illustrates a plan view of the path of the ion beam over the workpiece. The illustration is of the relative motion, although the most common implementation would be the ion beam moving in the fast scan direction and the workpiece moving in the slow scan direction, both relative to the fixed process chamber. The workpiece scanning system 200, for example, comprises a movable stage 140 whereon the substrate 105 resides, wherein the ion beam 110 is operable to scan the substrate 105 along a fast scan speed axis 142 and translate the wafer along a generally orthogonal slow scan axis 144 with respect to the ion beam 110. Given speeds of the beam along the fast scan speed axis 142 (also referred to as the "fast scan speed direction") can be, for example, significantly faster than a speed of the substrate along the slow scan axis 144 (also referred to as the "slow scan direction"). Thus the fast scan lines 145 appear horizontal. As the slow scan speed increases relative to the fast scan speed, the fast scan lines tilt. For convenience, the speeds of the beam along the fast scan speed axis 142 will be referred to as either "fast scan speed on wafer" or "fast scan speed off wafer" and the speed of the substrate along the slow scan axis 144 will be referred to as "slow scan speed". The transition between on wafer and off wafer speeds happens along the roughly circular boundary 105. The boundary is placed as close as possible to the wafer such that essentially no part of the beam impinges on the wafer. The exact location of the transition is determined from the beam size and the required dose uniformity. As is clearly seen, the distance the beam travels off the wafer is a function of the slow scan position.

Figure 3:
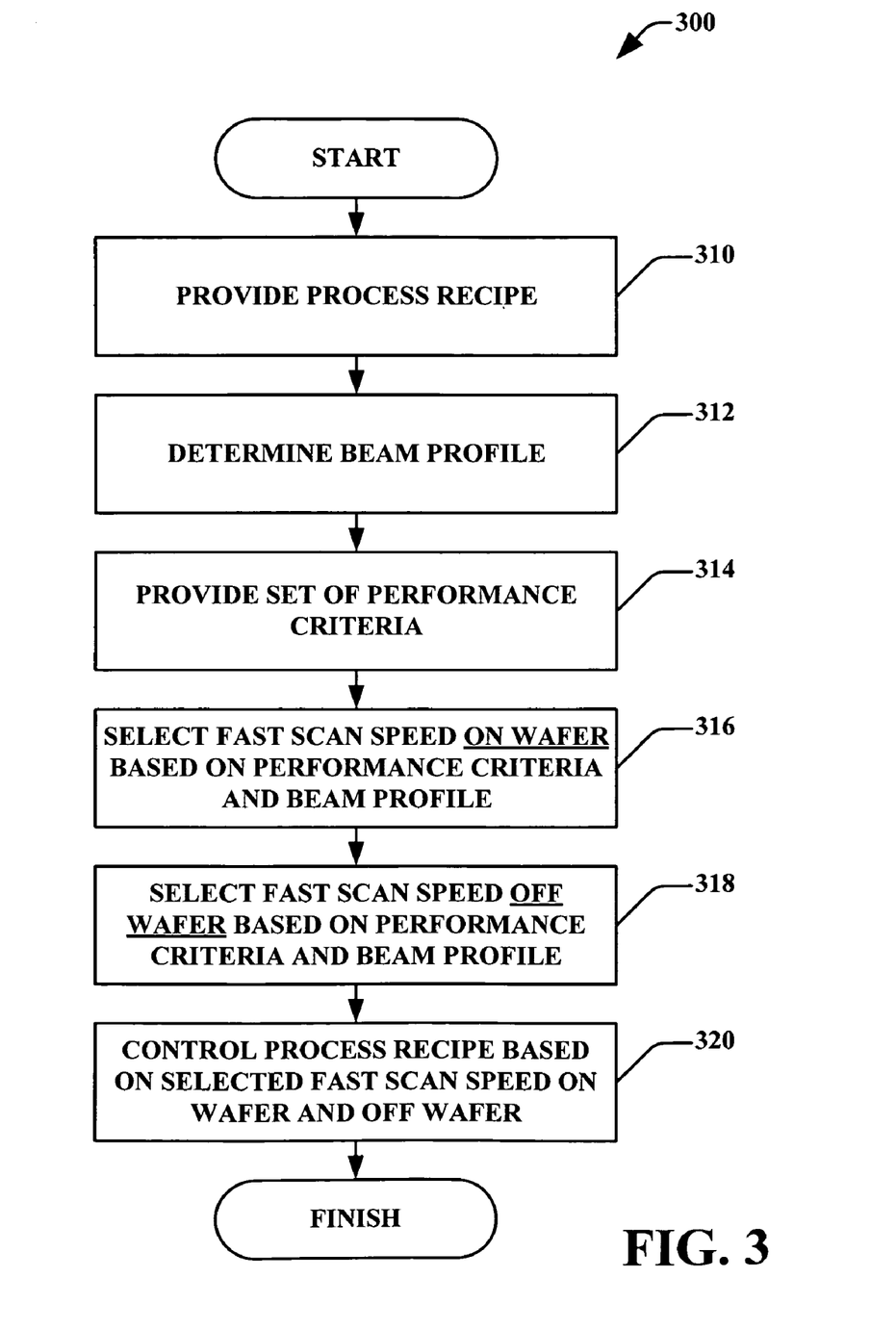
FIG. 3 is a block diagram of an exemplary method for optimizing an ion beam efficiency of an ion implantation system according to another exemplary aspect of the invention.

According to still another exemplary aspect of the present invention, FIG. 3 is a schematic block diagram of an exemplary method 300 illustrating an exemplary optimization of an ion implantation system, such as the exemplary ion implantation system 100 of FIG. 1. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated herein.

As illustrated in FIG. 3, the method 300 begins with act 310, wherein a process recipe for the ion implantation is provided. The process recipe, for example, comprises one or more of a desired ion beam current, ion beam energy, a desired dosage of ions implanted into the substrate, a maximum dose non-uniformity, and the like.

From the process recipe, the beam profile is set up in act 312. The appropriate current is delivered to the process chamber and the various other beam parameters are adjusted, such as beam size, for example. The beam size is determined so that the boundary between the two fast scan speeds can be set. This measurement is typically made with a dose cup that can be scanned through the beam along the fast scan axis.

In act 314, a set of performance criteria can be provided, for example. The various scan speeds can be set based on the process recipe and the measured beam profile at steps 316 and 318. The desired dose and beam current from the recipe can determine the minimum slow scan speed. The maximum speed can be determined from the beam height and the average slow scan speed and can be set based on the uniformity requirement. The controller typically can choose an optimum value based on a set of rules and the just described inputs, for example. The fast scan speeds can be determined by the limits of the fast scan drivers. The fast scan off wafer can be set to the maximum speed the driver can deliver and the fast scan speed on the wafer can be reduced by a multiple, typically 2-20, which can be determined by the uniformity in both directions, and is typically set to be as fast as possible, for example. The substrate can be implanted in act 320 with the beam as set up in the previous steps.

Figure 4:
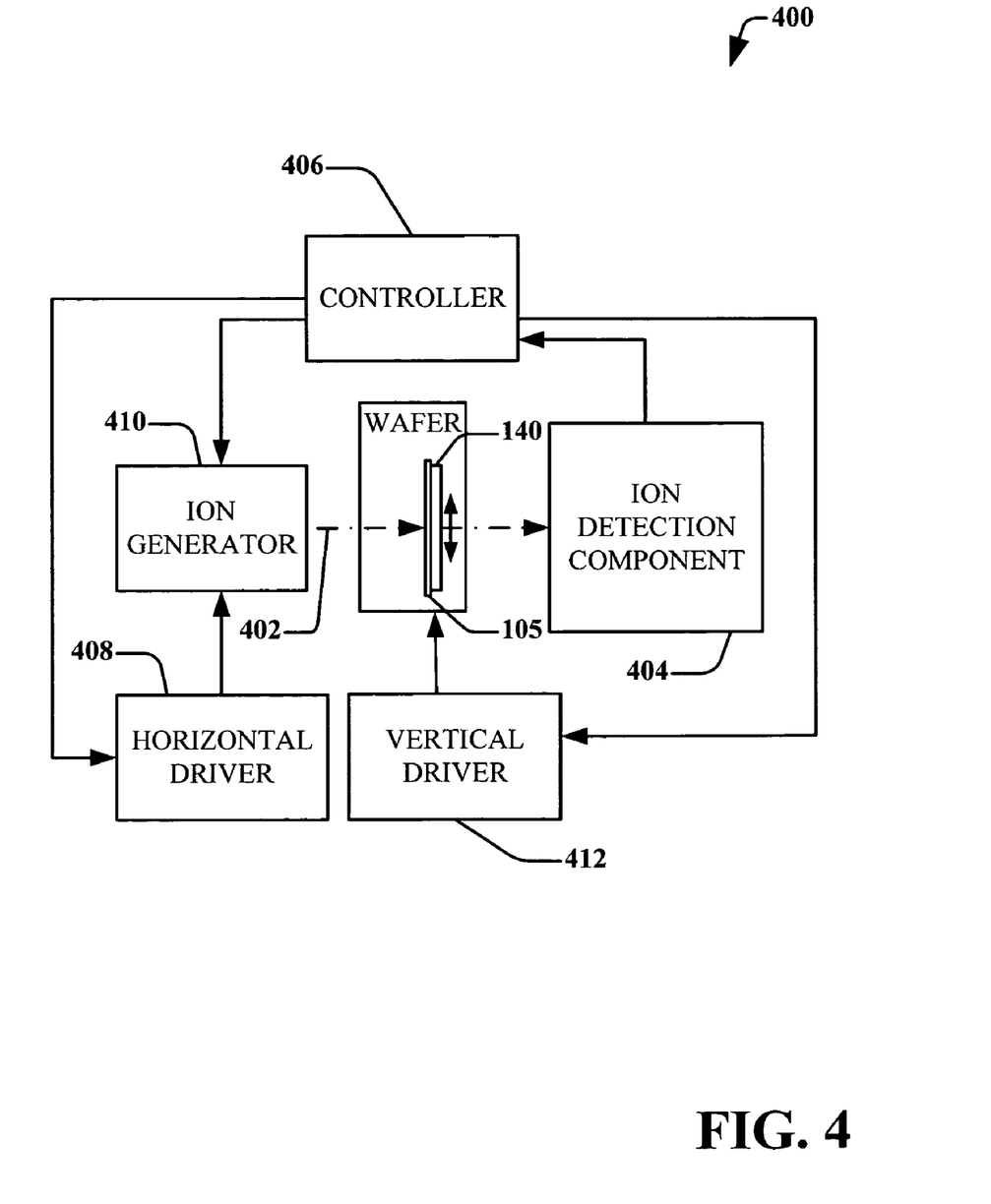
FIG. 4 is a schematic block diagram of an exemplary scanning system according to yet another aspect of the present invention.

Referring now to FIG. 4, a schematic illustration is provided of an exemplary ion implantation system 400 for optimizing ion implantation in accordance with the present invention. The ion implantation system 400 may operate in a similar fashion to the system 100 in FIG. 1. A substrate 105 as shown can be mounted to a stationary or moveable stage 140. The moveable stage 140, for example, can be translated in one axis or in two axes that are generally orthogonal to each other. However complex non-linear and rotational motions are contemplated in this invention. An ion beam, for example, can be scanned in a single axis across a stationary wafer, wherein the wafer is translated in one direction past the scanned ion beam or in an alternate aspect, the wafer can be translated in generally orthogonal axes with respect to a stationary ion beam or "spot beam".

The substrate 105 receives, for example, a scanned beam 402 from the ion dose generator 404. The initial beam setup can be generated in a similar manner to step 312 of method 300 of FIG. 3. The beam 402 current, for example, can be measured by the ion detection component 404 as the beam 402 moves past the substrate 105 outer edge. According to one aspect of the present invention, the system 400 is able to determine the beam current taking into account the acceleration from a "fast scan speed on wafer" to "fast scan speed off wafer" returning to the "fast scan speed on wafer". The system, for example, can determine that the ion beam 402 has moved from an "on wafer" position to an "off wafer" position by employing an ion detection component 404. As shown in FIG. 4, preferably system 400, as any portion of the ion beam 402 is on the wafer 105, a controller 406 directs, for example, a horizontal (first direction) driver 408 to direct an ion dose generator 410 to scan horizontally across the wafer 105 surface at a "fast scan speed on wafer" ($V_{FastScanOnWafer}$). The controller 406 then commands the horizontal driver 408, when the ion beam is off the wafer, to instruct the ion dose generator 410 to scan and then reverse direction at a "fast scan speed off wafer" ($V_{FastScanOffWafer}$). In electrostatic scan systems the ratio of $V_{FastScanOffWafer}$ to $V_{FastScanOnWafer}$ can be high, for example, larger than twenty (20) and in magnetic scan systems, the ratio may be similar to electrostatic systems in some circumstances, but will most often be lower, for example, 3. The controller 406 can also optimize the $V_{FastScanOffWafer}$ and the $V_{FastScanOnWafer}$ utilizing a process recipe, for example, a desired ion beam energy, a preferred ion beam diameter, a number of passes made by the substrate through the ion beam in the slow scan direction, a desired dosage of ions implanted into the substrate, a speed of the substrate in the slow scan direction, and the like. It is to be understood that the term controller can refer to a standard controller, regulator, driver, regulating device, drive electronics, and the like.

The controller 406 takes the beam current measurement from 404 and uses it to send commands to the slow scan driver 408 which updates the slow scan speed. It also takes the position of the substrate into account via a position sensor (not shown) and commands the fast scan driver 412 to adjust the boundary between the on-wafer and off-wafer fast scan speeds.

Figure 5:
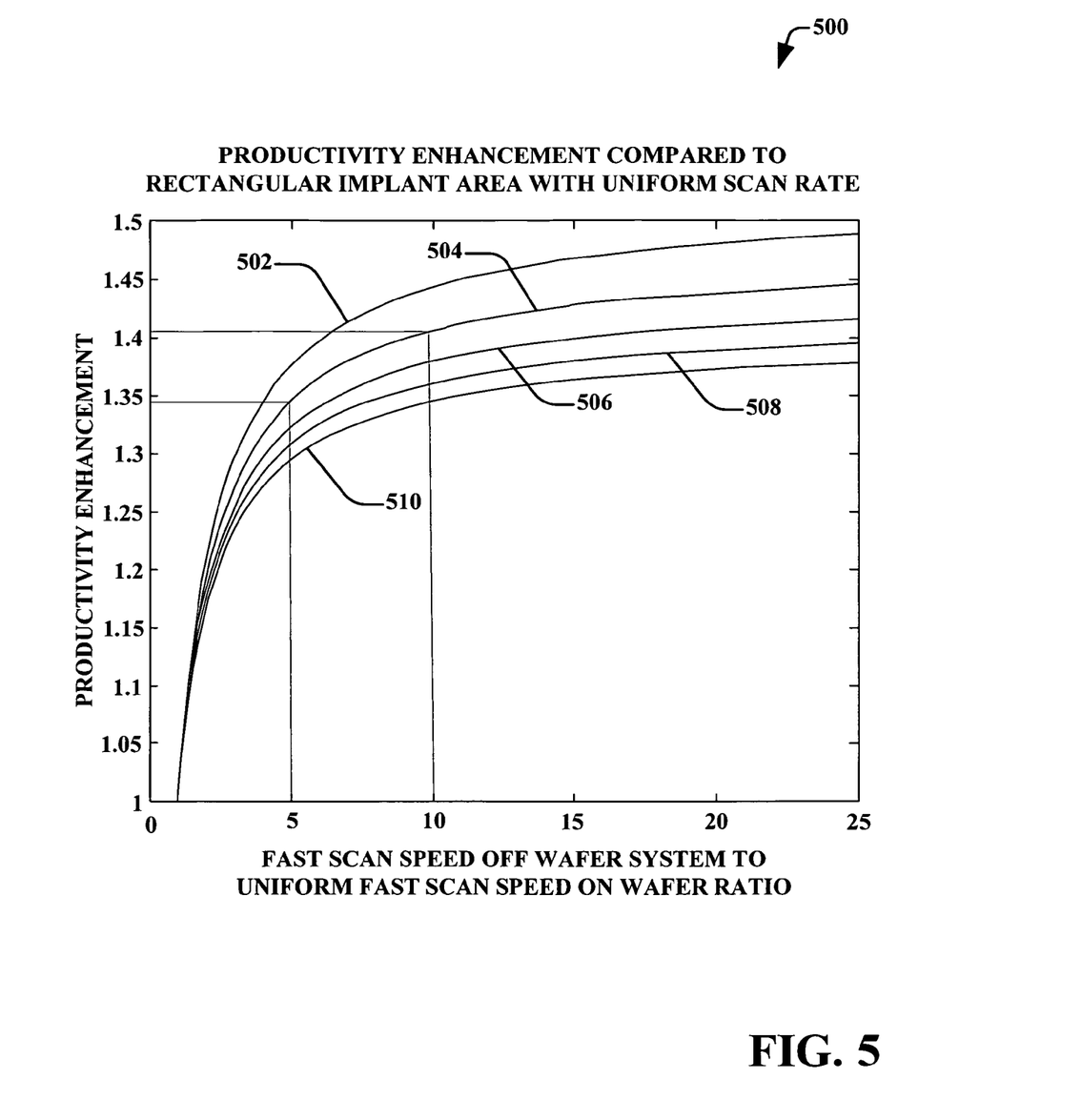
FIG. 5 is an exemplary graph according to one aspect of the present invention illustrating productivity enhancement compared to a fast to slow speed ratio.

Referring to FIG. 5, in one embodiment of the present invention, is a graph at 500 that illustrates representative theoretical productivity enhancement as a function of off-wafer to on-wafer speed, comparing varying ion beam radii data. The graph 500 includes five different exemplary groupings of data points 502, 504, 506, 508 and 510 corresponding to differing beam radii. Each graph was constructed employing 30 millimeter wide dose cups, a 300 millimeter diameter wafer, and assumes a uniform density circular beam. The beam radii represented by curves 502, 504, 506, 508, and 510 are 5 mm, 41.25 mm, 77.5 mm, 113.75 mm, and 150 mm, respectively, for example.

For example, it can be seen in the curve 504, wherein the productivity enhancement varies approximately forty nine percent (49%) over the entire range. Referring to chart 500 and curve 504, it can be seen, for example, that for a 41.25 radius pencil beam that given a ratio$_{FastToSlowSpeed}$ of 5 the productivity enhancement is about 1.34, or in other words a 34% improvement in productivity. The graph 504 also shows that if the ratio$_{FastToSlowSpeed}$ is doubled to 10 that the the productivity enhancement is approximately 1.41. Therefore it may be advantageous to only increase the fast scan speed off wafer to a given level whereat the increase in speed provides only a minimum productivity enhancement. Again, the data for graphs 502, 506, 508 and 510 indicate a similar pattern.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

The invention claimed is:

1. An ion implantation system that optimizes productivity, comprising:
    a first direction fast scan driver configured to receive commands from a controller;
        wherein the fast scan driver moves an ion beam at a speed comprising a fast scan speed on workpiece and a fast scan speed off workpiece;
    an ion generator configured to implant ions into a workpiece by scanning the ion beam in a first direction at the fast scan speed on workpiece;
        wherein the fast scan speed on workpiece is selected based on a set of performance criteria, the beam profile and the process recipe;
    a movable stage with a slow scan driver configured to move the workpiece at a slow scan speed in a second direction that is different than the first direction utilizing the controller; and
        wherein the fast scan speed off workpiece is selected based upon the set of performance criteria, the beam profile and the process recipe;
        wherein the fast scan speed off workpiece is faster than the fast scan speed on workpiece.

2. The ion implantation system as recited in claim 1, wherein the fast scan speed on workpiece is adjusted with the position of the ion beam in the second direction.

3. The ion implantation system as recited in claim 1, further comprising at least one ion detection component situated at approximately an outer edge of the workpiece.

4. The ion implantation system as recited in claim 1, wherein the first direction and the second direction are generally orthogonal to one another.

5. The ion implantation system as recited in claim 1, further comprising the slow scan driver configured to receive commands from the controller and move a workpiece movable stage in the second direction at a slow scan speed.

6. The ion implantation system as recited in claim 1, wherein the fast scan speed off workpiece is about 2 to 20 times faster that the fast scan speed on workpiece.

7. The ion implantation system as recited in claim 1, wherein the fast scan speed on workpiece is about 700 centimeters/sec. to 240000 centimeters/sec.

8. The ion implantation system as recited in claim 1, wherein the controller is configured to optimize productivity based on factors comprising a process recipe, a beam radius, a desired ion dosage, an actual measured ion dosage, a workpiece diameter, the fast scan speed, the slow scan speed, a rectangular ion distribution pattern and a dose cup width.

9. The ion implantation system as recited in claim 1, wherein the ion implantation system comprises one of the following: electrostatic, magnetic and mechanical.

10. The ion implantation system as recited in claim 1, wherein a desired maximum non-uniformity of the ion implantation has a standard deviation on the order of 0.5 percent across the workpiece.

11. A method of ion implanting a workpiece, comprising:
    providing a process recipe;
    scanning an ion beam in a first direction at a fast scan speed,
        wherein a fast scan speed on workpiece is different than a fast scan speed off workpiece; and
        wherein the fast scan speed on workpiece is selected based on a set of performance criteria and a measured beam profile;
        wherein the fast scan speed off workpiece is selected based upon the set of performance criteria and the measured beam profile;
    scanning the workpiece in a second direction at a slow scan speed, wherein the first direction and the second direction are different.

12. The method of claim 11, wherein the workpiece passes through the ion beam in a slow scan direction and the ion beam scans the workpiece in a fast scan direction.

13. The method of claim 11, further comprising providing a process recipe for ion implanting the workpiece, the process recipe comprising at least one of: a current of the ion beam, a dosage of ions, and a number of passes of the workpiece through the ion beam in the second direction.

14. The method of claim 13, wherein controlling the process recipe is based on at least one of the following: a desired maximum ion implantation non-uniformity, a throughput time for the workpiece, a desired minimum ion beam current, or at least one workpiece condition.

15. The method of claim 13, further comprising
    selecting one of a plurality of speeds in the second direction, based on the dosage of ions implanting the workpiece.

16. The method of claim 11, further comprising selecting another one of a plurality of fast scan speed on workpiece and a plurality of fast scan speed off workpiece in the first direction after controlling the process recipe, based on optimizing productivity of the ion implantation associated with the controlled process recipe.

17. The method of claim 11, wherein the fast scan speed off workpiece is between about 2 times and about 20 times the fast scan speed on workpiece.

18. The method of claim 11, wherein the fast scan speed on workpiece is between about 700 centimeters/sec. and about 240000 centimeters/sec.

19. The method of claim 11, wherein the slow scan speed on workpiece is between about 10 millimeters/sec. and about 400 millimeters/sec.

20. The method of claim 11, wherein a desired maximum non-uniformity of ion implantation of the workpiece has a standard deviation on the order of 0.5% across the workpiece.

21. The method of claim 11, wherein the ion beam oscillates in the fast scan direction at the fast scan speed on workpiece between approximately 10 Hz and 2000 Hz, and wherein the workpiece oscillates in the second direction between approximately 0.06 Hz and approximately 1 Hz.

22. The method of claim 11, wherein an ion generator is configured to implant ions into the workpiece by moving the workpiece in the first direction through a stationary beam.

23. A method for optimizing ion implantation of a workpiece; comprising the steps of:
    providing a process recipe;
    determining a beam profile;
    providing a set of performance criteria;
    selecting a fast scan speed on workpiece in a first direction based on the performance criteria and beam profile;
    selecting a fast scan speed off workpiece in the first direction based on the performance criteria and the beam profile;
    selecting a slow scan speed in a second direction; and
    controlling the process recipe based on the fast scan speed off wafer and the fast scan speed on wafer;
        wherein the second direction is generally orthogonal to the first direction.

24. The method of claim 23, wherein selecting one of a plurality of fast scan speed on workpiece and one of a plurality fast scan speed off workpiece in the fast scan direction is further based on optimizing productivity.

25. The method of claim 23, wherein the fast scan speed on workpiece is about 700 centimeters/sec. to 240000 centimeters/sec.

26. The method of claim 23, wherein the fast scan speed off workpiece is between about 2 times and about 20 times the fast scan speed on workpiece.

27. The method of claim 23, wherein the slow scan speed is between about 10 millimeters/sec. and about 400 millimeters/sec.

28. The method of claim 23, wherein selecting the one of a plurality of fast scan speed on workpiece and the one of a plurality of fast scan speed off workpiece in the first direction further consists of one or more than one desired workpiece conditions.

29. The method of claim 23, wherein a controller optimizes productivity based on factors comprising a process recipe, a beam radius, a desired ion dosage, an actual measured ion dosage, a wafer diameter, a slow scan speed, a fast scan speed, a rectangular ion distribution pattern and a dose cup width.

* * * * *